(12) United States Patent
Homol et al.

(10) Patent No.: US 6,181,173 B1
(45) Date of Patent: Jan. 30, 2001

(54) POWER-ON RESET CIRCUIT

(75) Inventors: David K. Homol; Alan R. Holden; Nikolaus Klemmer, all of Apex; Domenico Arpaia, Cary, all of NC (US)

(73) Assignee: Ericsson Inc., Research Triangle Park, NC (US)

( * ) Notice: Under 35 U.S.C. 154(b), the term of this patent shall be extended for 0 days.

(21) Appl. No.: 09/164,608

(22) Filed: Oct. 1, 1998

(51) Int. Cl.⁷ .......................... H03K 17/22; H03K 17/20
(52) U.S. Cl. ................................. 327/143; 327/198
(58) Field of Search .................................. 327/142, 143, 327/198, 545

(56) References Cited

U.S. PATENT DOCUMENTS

| | | | |
|---|---|---|---|
| 4,717,840 | * 1/1988 | Ouyang et al. | 327/143 |
| 4,812,679 | * 3/1989 | Mahabadi | 327/143 |
| 5,528,182 | * 6/1996 | Yokosawa | 327/143 |
| 5,847,586 | * 12/1998 | Burstein et al. | 327/143 |
| 5,852,377 | * 12/1998 | Pitsch | 327/143 |
| 5,883,532 | * 3/1999 | Bowers | 327/143 |
| 5,959,477 | * 12/1998 | Chung | 327/143 |
| 6,005,423 | * 12/1999 | Schultz | 327/143 |

OTHER PUBLICATIONS

Bonicatto, Damian, Reset Circuit Solves Brownout Problems, EDN, Oct. 16, 1986, pp. 236.
Colotti, James, Power–reset circuit provides four functions, EDN, Jul. 11, 1985, pp. 281.
Eichel, Hans, Circuit resets CMOS uPs, EDN, Mar. 22, 1984, pp. 256, 259.
Wise, Stephen, IC provides reset or detects power failures, EDN, Nov. 14, 1985, pp. 314, 317.

* cited by examiner

*Primary Examiner*—Timothy P. Callahan
*Assistant Examiner*—Terry L. Englund
(74) *Attorney, Agent, or Firm*—Wood, Phillips, VanSanten, Clark & Mortimer

(57) ABSTRACT

A power-on reset circuit for resetting the register values contained on an integrated circuit upon power-up of the integrated circuit. The power-on reset circuit can be implemented either internal or external to the integrated circuit. The power-on reset circuit generates a reset signal as long as the supply voltage is not in the operational range and maintains the reset signal for a certain time after the supply voltage has returned to its nominal value. The power-on reset circuit also provides accurate detection of a serious supply voltage drop and has low power consumption. The power-on reset circuit comprises a battery, a voltage-referenced switching circuit, a current source, a capacitor and a voltage buffer.

10 Claims, 4 Drawing Sheets

SIMPLE RC POWER-ON RESET CIRCUIT

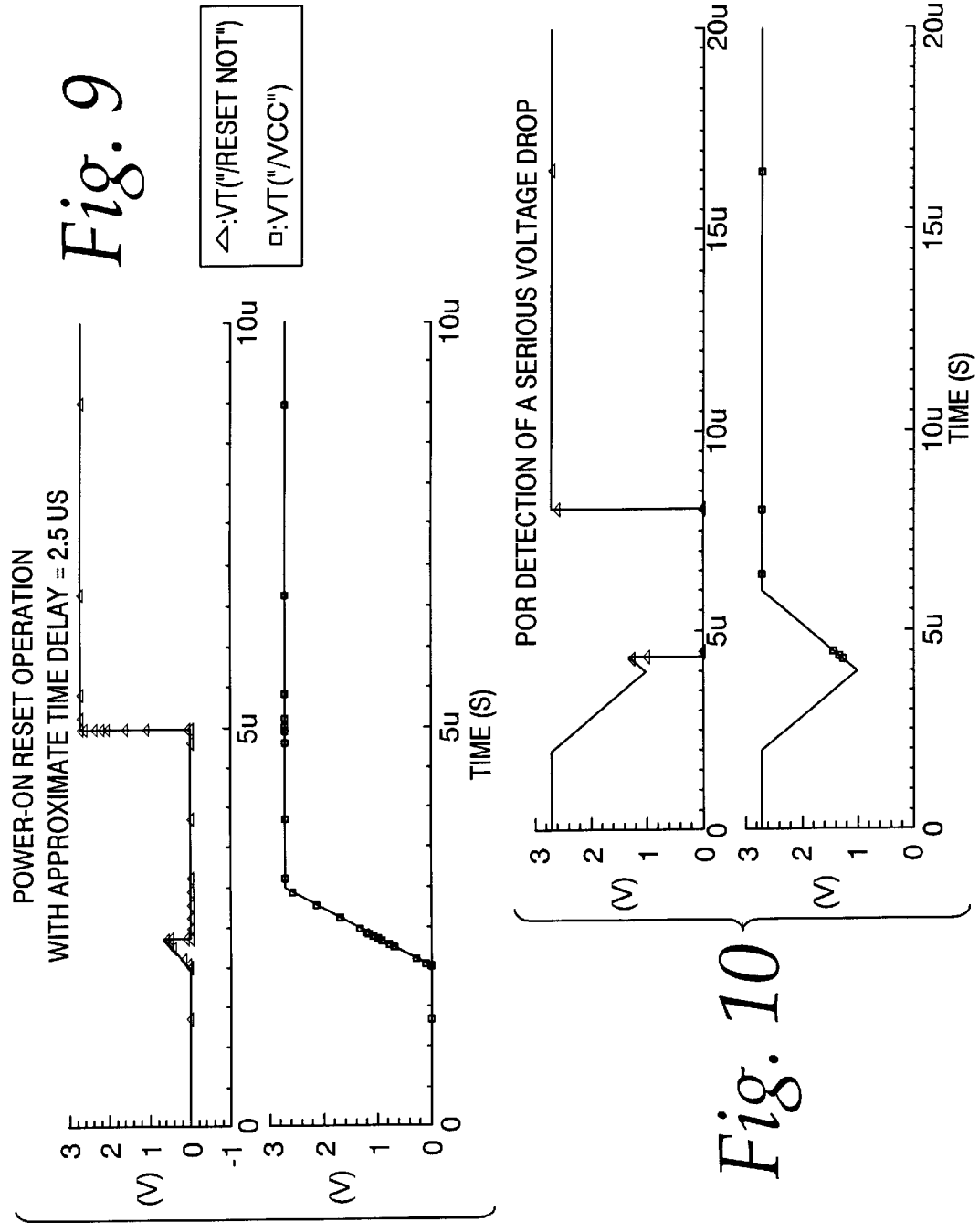

POWER-ON RESET CIRCUIT

BACKGROUND

1. Field of the Invention

This invention relates generally to a power-on reset circuit used in electronic devices and particularly to a power-on reset circuit required upon the power-up of an integrated circuit to set the integrated circuit to a known and predefined state.

2. Related Art

Integrated circuit (IC) technology continues to advance, with ICs able to perform a greater number of increasingly complex functions. Consequently, the power consumption of ICs is increasing with the increasing complexity of the IC. Furthermore, there is a demand for longer battery life in mobile electronic systems, therefore, power consumption is a major concern in designing mobile electronic systems. Decreasing power consumption decreases cooling costs, power supply costs, packaging costs, and improves reliability. At times when an IC is not operating, the battery can be disconnected from the IC to disable operation of the chip, reducing power consumption.

A concern in powering-up an IC after the battery has been disconnected is the state into which each of the registers in the IC enters upon power-up. If a single latch or flip-flop powers-up into an undesirable state, a catastrophic failure of the IC may occur. Therefore, at power-on of the IC, each register must be cleared to a predefined state by a power-on reset (POR) circuit. Then, after a predetermined interval of time, the IC is able to enter values into the registers. In this way, the first state of all of the registers at power-on of the IC is always the cleared state. Therefore, the IC will always power-up properly. The POR circuit allows resetting to predetermined register values, allowing the IC to be used immediately without performing any programming operations.

In the past, a common POR circuit compared two voltages with a simple comparator as shown in FIG. 1. A comparator compares two input voltages (V+ and V− ) and outputs a high or low voltage signal depending on whether V+ is higher or lower in voltage value than V−. As used herein, a high output voltage signal refers to the battery voltage while a low output voltage signal refers to ground.

It is well known in the art that a comparator comprises a differential pair of transistors having inputs at the positive and negative inputs of the comparator. As shown in FIG. 1, the positive input of the comparator is connected to a resistor/capacitor divider and the negative input to the comparator is connected to a completely resistive voltage divider.

Timing diagrams of the comparator POR circuit are included in FIG. 1. During power-up of the voltage supply, the completely resistive voltage divider follows the rise of the supply voltage, but at a lower voltage. Thus, V− will be at a lower voltage than the supply voltage as it rises with the supply voltage during power-up. The resistor/capacitor divider voltage will rise as the capacitor begins to charge to the final supply voltage value as shown in FIG. 1. The capacitor functions as an open circuit under DC conditions, therefore, current will not flow through the capacitor, and the capacitor will eventually maintain the final supply voltage value after it is fully charged.

The resistor/capacitor divider voltage, V+, will charge slower than the completely resistive divider voltage, V−. The resistor/capacitor voltage, V+, will eventually match or 'compare' with the value of V− and continue to increase to the larger supply voltage value. Prior to the input voltage comparison, the output of the comparator will be low since V+ will be at a lower voltage than V−. A low output comparator voltage resets all registers on the IC. At the point of comparison, when V+ equals V−, the comparator changes from a low to high output value, thus releasing register control of the IC back to the inputs of the registers. The dashed line in the timing diagrams displays the time where V+ and V− are compared, changing the state of the output.

A disadvantage of the comparator POR circuit shown in FIG. 1 occurs when the battery supply voltage ramps up slowly. As the battery supply voltage ramps up slowly, the capacitive delay is eliminated because the capacitor charges as fast as the voltage rises. Thus the capacitor voltage maintains the supply voltage while the completely resistive divider remains lower than the supply voltage. Therefore when a comparator has an input where V+ is always higher than V−, the output is always high, and no reset operation occurs, causing failure of the IC.

Another common POR circuit is the basic voltage referenced dualcomparator circuit shown in FIG. 2. This circuit consists of two comparators with a voltage reference applied at opposite polarity terminals of each comparator. The first comparator has a resistive divider at its negative input while the second has a current source, transistor switch and a capacitor at the positive input.

The timing diagrams in FIG. 2 shows the operation of the dualcomparator POR circuit. Upon power-up of the supply voltage, the first comparator output voltage will change from high to low when $V_{-1}$ compares to $V_{+1}$, the voltage reference. The behavior of the transistor switch is determined by the output of the first comparator. When the output of the first comparator is a high voltage upon power-up, the transistor switch is "on" and sinks all current from the current source. When the voltage of $V_{-1}$ reaches and exceeds $V_{+1}$, the output of the first comparator changes to low voltage, and the transistor switch is "off," preventing current flow through the transistor switch. The current then travels to the capacitor and begins raising the voltage of $V_{+2}$.

The output of the second comparator is low initially since the reference voltage, $V_{-2}$, is higher than $V_{+2}$ because $V_{+2}$ is shorted by the transistor switch to ground. When the transistor switch turns "off," the capacitor at $V_{+2}$ charges up to a voltage that exceeds $V_{-2}$, and the output of the second comparator changes from low to high voltage. When the output of the second comparator is low voltage, the circuit resets the IC register system as needed.

A disadvantage of the dual-comparator POR circuit is the use of a voltage reference which must be operational during the power-up of the IC, or turned on before power-up of the IC to provide a voltage reference to the POR circuit. The voltage reference must be either external to the chip or designed on-chip. Utilizing a voltage reference in a POR circuit in mobile electronic devices results in additional costs, power consumption and complexity.

Implementing an on-chip voltage reference requires providing for the circuit to turn the voltage reference on before or during power-up of the IC. Powering the voltage reference at all times results in increased power consumption. In the alternative, repeatedly powering-up voltage reference accurately, internal or external to the IC, is difficult, inconvenient, and adds complexity to IC design. Additionally, if implemented external to the IC, the voltage reference requires that a pin or pins be added to the IC, adding further complexity and size to the IC.

Another common method of resetting the registers in an IC is by utilizing the circuit shown in FIG. 3. The circuit shown in FIG. 3 uses a programmable unijunction transistor (PUJT) to simplify the design. In the past, POR circuits used a resistor/capacitor configuration (RC) shown to the right of the dashed line in FIG. 3. The RC provides a delay in the rise of the battery supply voltage as the capacitor charges up, resetting the registers in the IC system. The addition of a PUJT and the resistors on the left hand side of the dashed line in FIG. 3 to the RC POR circuit removes the need to detect a voltage drop. The PUJT is basically a p-n-p-n device with an anode gate. FIG. 4 shows the PUJT in greater detail.

With the addition of the PUJT and a resistor to the RC POR circuit, the capacitor supports the anode voltage as $V_{cc}$. When the battery voltage drops, the PUJT triggers when its gate drops to about 0.7V below the anode. The capacitor discharges when the PUJT triggers, ensuring a reset by pulling the reset line low to implement a full register reset.

The first disadvantage of the RC POR circuit is that it requires a fast power-up and power down of the battery supply voltage. If the supply voltage powers up or down too slowly the RC time delay does not occur and reset does not generate a reset signal. Additionally, the RC POR circuit fails to provide accurate detection of a large supply voltage drop and does not provide the needed reset signal to prevent erratic operation of the IC.

The second disadvantage is that the RC components need to be so large that they may need to be implemented external to the IC. Furthermore, PUJTs are not available in IC fabrication technology so the PUJT must be implemented external to the IC. Also, if the voltage supply decreases slowly, capacitance slowly discharges, and the PUJT gate never becomes 0.7 volts below the anode of the PUJT, and no reset operation occurs.

SUMMARY OF THE PRESENTLY PREFERRED EMBODIMENT

A preferred embodiment of the present invention comprises a POR circuit that will perform a reliable reset operation upon power-up of an IC under all conditions. Recognizing that the POR circuit is critical for proper IC operation, reliability of the POR circuit is paramount. Moreover, the POR circuit can be implemented either internal or external to the IC. The POR circuit generates a reset signal as long as the supply voltage is not in the operational range, to prevent undefined operations of the IC. The POR circuit also maintains the reset signal for a certain time after the supply voltage has returned to its nominal value, to ensure a proper reset of the IC.

The POR circuit also provides accurate detection of a serious supply voltage drop. The POR circuit achieves each of the above with low power consumption.

Since registers in an IC consist of flip-flops and latches, the preferred embodiment ensures that the supply voltage is always high enough during power-up to perform a reset of all registers. The battery supply voltage is exposed to a very large amount of board and IC circuitry, therefore, the supply voltage may rise relatively slowly. Therefore, the preferred embodiment ensures that a reset will occur when the supply voltage has reached a level where the registers will respond to a voltage reset. To verify that the supply voltage level is sufficient during a reset upon power-up, the present invention incorporates a voltage-referenced switching circuit to trigger a delay before releasing control of the registers to the IC registers.

These and other features and advantages of the invention will be apparent upon consideration of the following detailed description of the preferred embodiments of the invention, taken in conjunction with the appended drawings.

BRIEF DESCRIPTION OF THE DRAWINGS

FIG. 9 is a timing diagram of a preferred embodiment of the present invention.

FIG. 10 is a timing diagram of a preferred embodiment of the present invention.

DETAILED DESCRIPTION OF THE PRESENTLY PREFERRED EMBODIMENTS

Figure 1:
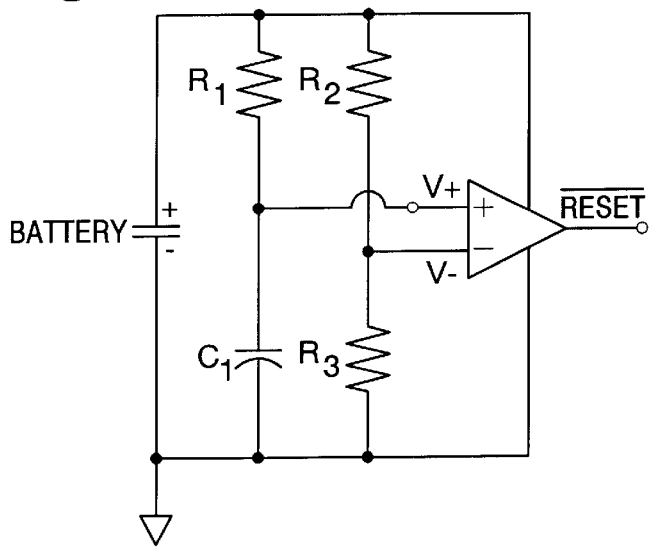
FIG. 1 is a circuit diagram of a prior art comparator POR circuit.
Figure 1:
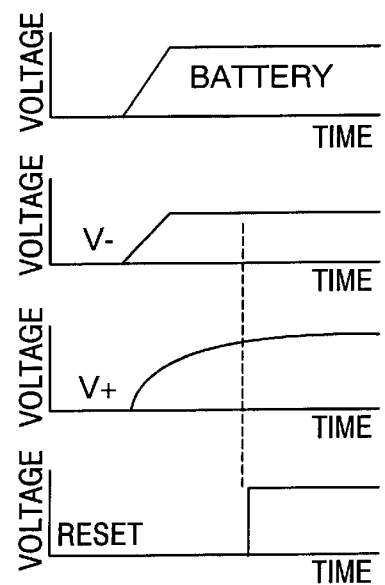
Figure 2:
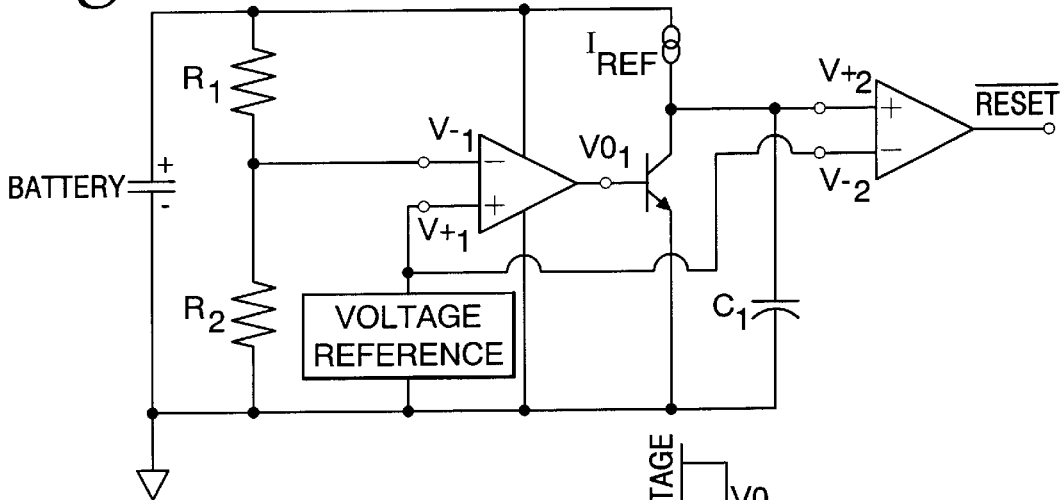
FIG. 2 is a circuit diagram of a prior art dual-comparator POR circuit.
Figure 2:
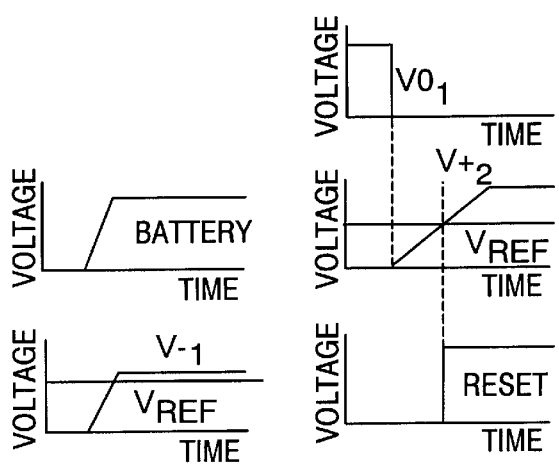
Figure 3:
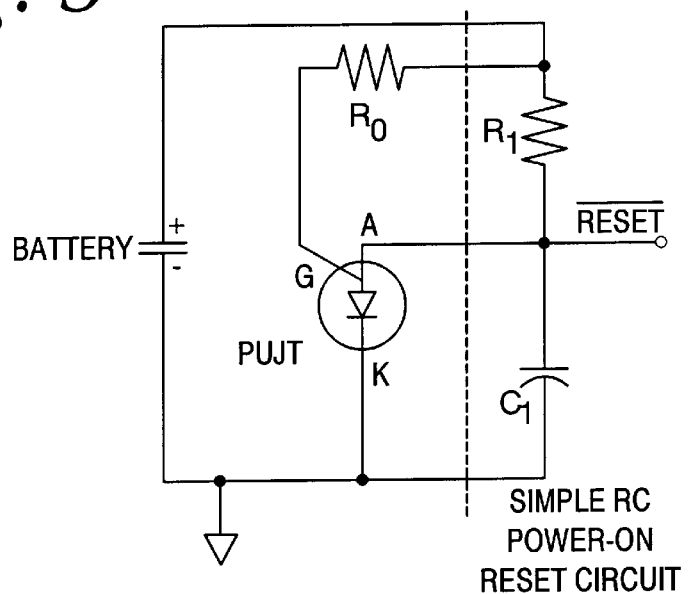
FIG. 3 is a circuit diagram of a prior art RC POR circuit.
Figure 4:
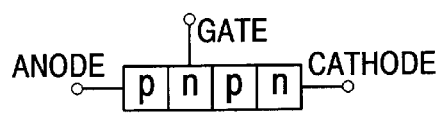
FIG. 4 is a diagram of a programmable unijunction transistor.
Figure 5:
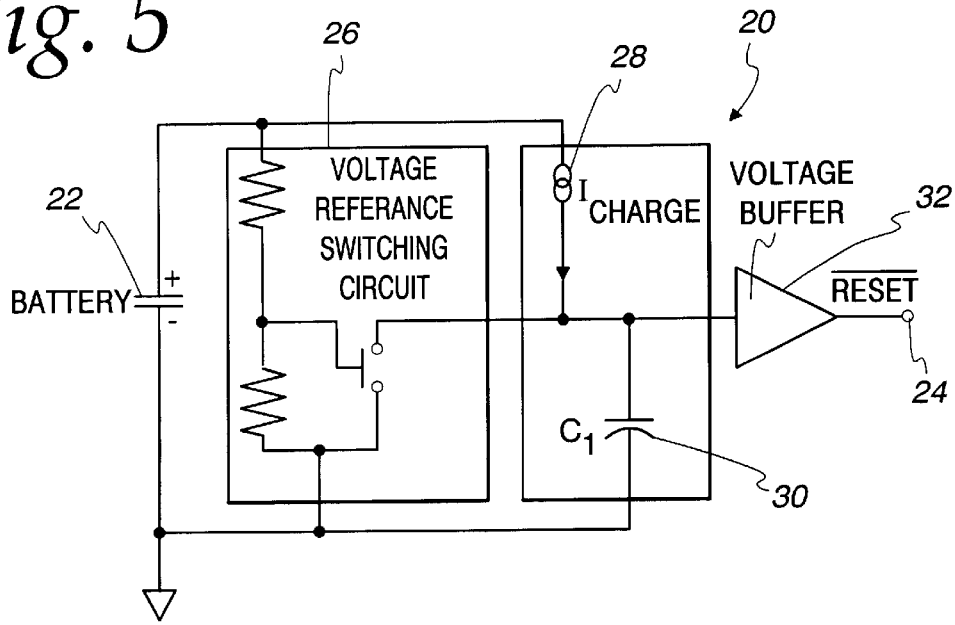
FIG. 5 is a circuit diagram of a preferred embodiment of the present invention.

Referring to FIG. 5, a circuit diagram of a preferred embodiment of the present invention is shown. A POR circuit 20 having a battery 22 and an output reset signal 24 is shown. A voltage-referenced switching circuit 26 is coupled with the battery 22, a current source 28 and capacitor 30. Together, the current source 28 and capacitor 30 create a delay that maintains a low output reset signal 24 for a specific amount of time. As the capacitor 30 is charged, the voltage level across the capacitor 30 is raised. A voltage buffer 32 is coupled with the capacitor 30 to create a sharp voltage output transition from low to high to release control from the POR circuit 20 to the IC system registers.

Figure 6:
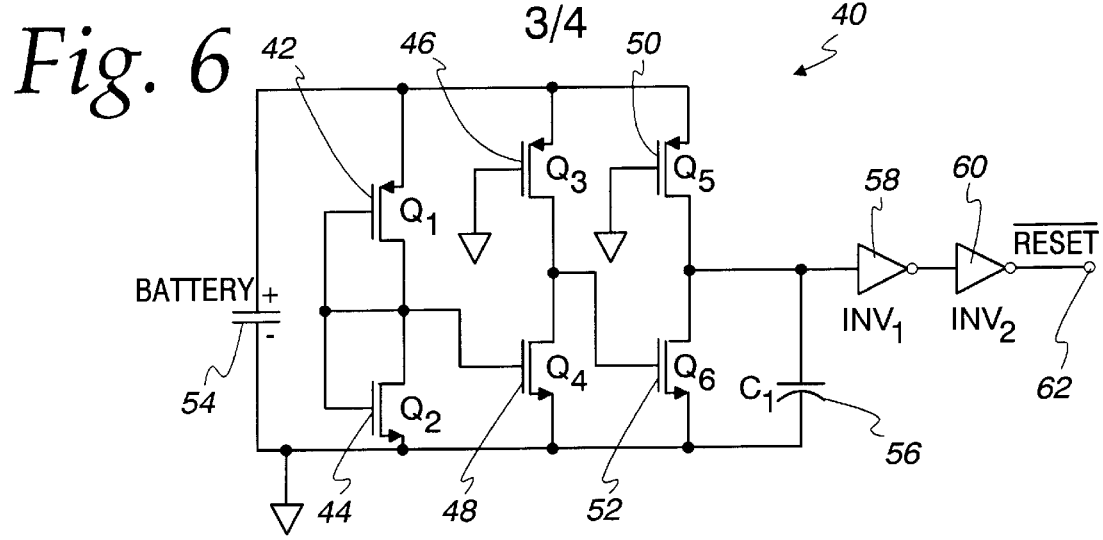
FIG. 6 is a circuit diagram of a preferred embodiment of the present invention.

Referring to FIG. 6, a preferred embodiment of the present invention is shown. A complementary metal-oxide silicon (CMOS) POR circuit 40 is shown consisting of a plurality of PMOS transistors 42 ($Q_1$), 46 ($Q_3$) and 50 ($Q_5$) and NMOS transistors 44($Q_2$), 48($Q_4$) and 52 ($Q_6$), a battery 54, a capacitor 56, two inverters 58 and 60, and a reset output 62. $Q_1$ 42 and $Q_2$ 44 together comprise a voltage divider wherein $Q_1$ 42 and $Q_2$ 44 are coupled together by their respective drains and gates as shown and the source of $Q_1$ 42 is coupled with the battery 54 and the source of $Q_2$ 44 is coupled with ground. $Q_3$ 46 and $Q_4$ 48 are coupled together by their respective drains as shown. The source of $Q_3$ 46 is coupled with the battery 54 while the gate of $Q_3$ 46 is coupled with ground. The source of $Q_4$ 48 is coupled with ground while the gate of $Q_4$ 48 is coupled with the drains and gates of $Q_1$ 42 and $Q_2$ 44. $Q_5$ 50 and $Q_6$ 52 are coupled together by their respective drains as shown. The source of $Q_5$ 50 is coupled with the battery 54 while the gate of $Q_5$ 50 is coupled with ground. The source of $Q_6$ 52 is coupled with ground while the gate of $Q_6$ 52 is coupled with the drains of $Q_3$ 46 and $Q_4$ 48. The capacitor 56 is coupled with the drains of $Q_5$ 50 and $Q_6$ 52 and to ground. Together, the PMOS and NMOS transistors, 42–52, operate to charge and discharge the capacitor 56.

The CMOS voltage divider comprising $Q_1$ 42 and $Q_2$ 44 is designed to emulate a 1:1 resistive divider. The threshold voltage of the PMOS transistors 42, 46 and 50 is $V_{tp}$. The threshold voltage of the NMOS transistors 44, 48 and 52 is $V_{tn}$. Upon power-up of the circuit, when the battery 54 is connected, the gate of $Q_1$ 42 is at zero voltage, which is less than $V_{tp}$, so $Q_1$ 42 allows current to flow from the source to the drain. At the same instance, the gate of $Q_2$ 44 is also at zero voltage, which is not greater than $V_{tn}$, so $Q_2$ 44 does not allow current to flow from the drain to the source. As $Q_1$ 42 allows current to flow from the source to the drain, the voltage at the gate of $Q_2$ 44 begins to rise and becomes greater than $V_{tn}$, and $Q_2$ 44 begins to allow current to flow from the drain to the source. Likewise, at the instant the battery 54 is connected, the gate of $Q_4$ 48 is at zero voltage, which is not greater than $V_{tn}$, so it does not allow current to flow from its drain to its source. At the same time, the gates of $Q_3$ 46 and $Q_5$ 50 are connected to ground, so $Q_3$ 46 and $Q_5$ 50 allow current to flow from their sources to their drains. As a result, the gate of $Q_6$ 52 has a higher voltage than $V_{tn}$ and $Q_6$ 52 allows current to flow from its drain to its source. As $Q_1$ 42 allows current to flow from the source to the drain, the voltage at the gate of $Q_4$ 48 begins to rise above $V_{tn}$, and $Q_4$ 48 begins to allow current to flow from the drain to the source. As a result, the voltage at the gate of $Q_6$ 52 drops below $V_{tn}$, and the flow of current from its drain to its source is stopped. Current then flows through the capacitor 56, charging the capacitor 56. Thus, charging of the capacitor 56 occurs at $V_{cc}=V_{tp}+V_{tn}$.

$Q_5$ 50 can be modeled as a resistor. This model resistor, combined with the capacitor 56, form a time delay that ensures the reset of the IC during a very rapid supply voltage rise. After the supply voltage rises above the operational range of the IC register's maximum $V_t$ ($V_{tp}$ for PMOS and $V_{tn}$ for NMOS), each flip flop and latch on the IC requires a certain amount of time for the reset signal 62 to be active to allow a reset operation to occur. If a very fast supply rise time does not provide a sufficient time interval between reaching the values of the IC register's maximum $V_t$ and the CMOS POR circuit 40 control release voltage, a properly calculated time delay can lengthen the reset time interval. As a result, the active reset signal of the CMOS POR circuit 40, as required by the flip flop or latch with the maximum reset time requirement, will be sufficiently long to allow reset of the IC.

It is the time delay which also provides for the maintenance of the reset signal for a certain time after the supply voltage returns to its nominal value. Consequently, once the capacitor 56 is charged to $V_{tn}$, inverter 58 will turn on and invert the high capacitance voltage to a low ground voltage which is then inverted high by inverter 60. The change of inverter 60 output voltage from low to high thus releases control to the IC's registers.

Additionally, the CMOS POR circuit 40 can detect serious voltage drops of approximate supply voltage levels of $V_{tp}+V_{tn}$, and provide a reset signal 62 upon voltage drop detection. Specifically, when the battery 54 falls to $V_{tp}+V_{tn}$, a reset signal 62 is generated. This operation is important for detecting supply voltage drops and rapid discharge of the capacitor 56, and is an important design consideration to ensure reset under the voltage drop condition. The capacitor can rapidly be discharged by designing $Q_6$ 52 to have a large width and small gate length to enable a large and rapid current drain to ground. By discharging the capacitor 56, the input of the voltage buffer is forced low to reset the system as intended.

The transistors $Q_1$ 42, $Q_2$ 44 and $Q_3$ 46 in FIG. 6 can be scaled to minimize current flow to improve power efficiency. Transistor $Q_5$ 50 can be scaled to increase or decrease delay time. Therefore, the CMOS POR circuit 40 has been designed in such a way as to be at nearly $2V_t$ (or≅1.6 Volts) when it sends the delayed POR control release signal. When the battery 54 reaches approximately $2V_t$, register reset is ensured since each set/reset register only requires the supply to be equal to $V_t$ for proper reset operation. Therefore, even given the circumstances of process and temperature variation, quick battery voltage rise and fall times, or voltage drops below a voltage of approximately $2V_t$, the CMOS POR circuit 40 is guaranteed proper register reset operation.

Figure 7:
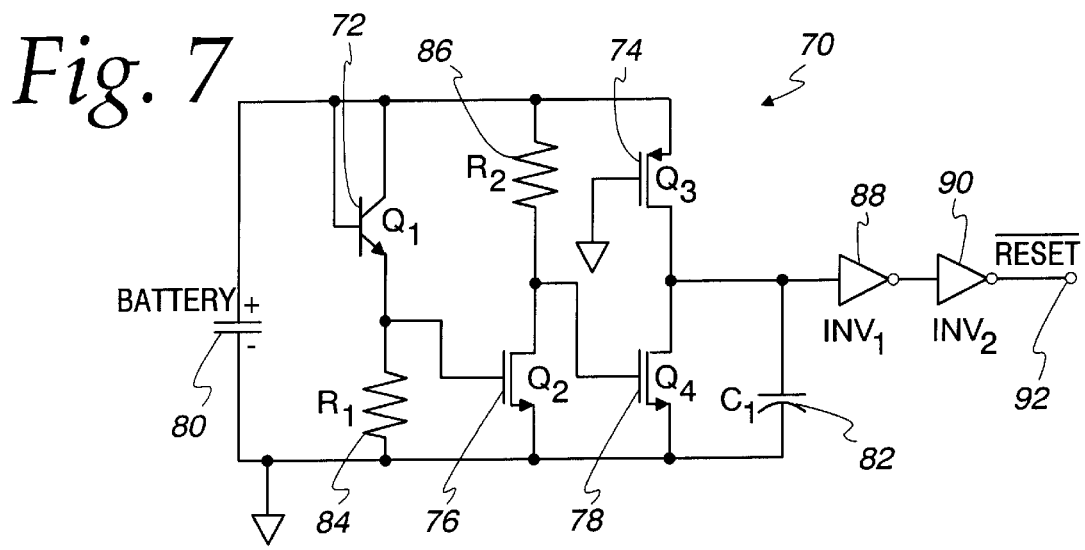
FIG. 7 is a circuit diagram of a preferred embodiment of the present invention.

Referring now to FIG. 7, an alternate embodiment of the present invention is shown. FIG. 7 shows a bipolar complementary metal-oxide silicon (BiCMOS) POR circuit 70 consisting of a transistor 72 ($Q_1$), a PMOS transistor 74 ($Q_3$), a plurality of NMOS transistors 76 ($Q_2$) and 78 ($Q_4$), a battery 80, a capacitor 82, two resistors 84 and 86, two inverters 88 and 90, and a reset output 92. $Q_1$ 72 and resistor 84 together comprise a diode-resistor voltage divider wherein the base and collector of $Q_1$ 72 are coupled with the battery 80, the emitter of $Q_1$ 72 is coupled with resistor 84 and resistor 84 is coupled with ground as shown. The gate of $Q_2$ 76 is coupled with the emitter of $Q_1$ 72, the source of $Q_2$ 76 is coupled with ground and the drain of $Q_2$ 76 is coupled with resistor 86. Resistor 86 is coupled with the battery 80. The gate of $Q_3$ 74 is coupled with ground, the source of $Q_3$ 74 is coupled with the battery 80 and the drain of $Q_3$ 74 is coupled with the drain of $Q_4$ 78. The gate of $Q_4$ 78 is coupled with the drain of $Q_2$ 76 and the source of $Q_4$ 78 is coupled with ground. The capacitor 82 is coupled with the drains of $Q_3$ 74 and $Q_4$ 78 and to ground.

The threshold voltage of the PMOS transistor 74 is $V_{tp}$. The threshold voltage of the NMOS transistors 76 and 78 is $V_{tn}$. The threshold voltage of the transistor 72 is $V_{DIODE}$. Upon power-up of the circuit, when the battery 80 is connected, the voltage at the base of $Q_1$ 72 is greater than $V_{DIODE}$, so $Q_1$ 72 allows current to flow from the collector to the emitter. At the same instance, the gate of $Q_2$ 76 is at zero voltage, which is not greater than $V_{tn}$, so $Q_2$ 76 does not allow current to flow from the drain to the source. At the instant the battery 80 is connected, the voltage of gate of $Q_4$ 78 is greater than $V_{tn}$, so current is able to flow from its drain to its source. At the same time, the gate of $Q_3$ 74 is connected to ground, so $Q_3$ 74 allows current to flow from its source to its drain. As $Q_1$ 72 allows current to flow from the collector to the emitter, the voltage at the gate of $Q_2$ 76 begins to rise and becomes greater than $V_{tn}$, and $Q_2$ 76 begins to allow current to flow from the drain to the source. As $Q_2$76 allows current to flow from the source to the drain, the voltage at the gate of $Q_4$ 78 begins to drop below $V_{tn}$, and $Q_4$ 78 does not allow current to flow from the drain to the source. Current then flows through the capacitor 82, charging the capacitor 82. Thus, charging of the capacitor 56 occurs at $V_{cc}=V_{Diode}+V_{tn}$.

$Q_3$ 74 can be modeled as a resistor. This model resistor, combined with the capacitor 82, form a time delay that ensures the reset of the IC during a very rapid supply voltage rise. After the supply voltage rises above the operational range of the IC register's maximum $V_t$ ($V_{tp}$ for PMOS and $V_{tn}$ for NMOS), each flip flop and latch on the IC requires a certain amount of time for the reset signal 92 to be active to allow a reset operation to occur. If a very fast supply rise time does not provide a sufficient time interval between reaching the values of the IC register's maximum $V_t$ and the BiCMOS POR circuit 70 control release voltage, a properly calculated time delay can lengthen the reset time interval. As a result, the active reset signal of the BiCMOS POR circuit 70, as required by the flip flop or latch with the maximum reset time requirement, will be sufficiently long to allow reset of the IC.

It is the time delay which also provides for the maintenance of the reset signal for a certain time after the supply voltage returns to its nominal value. Consequently, once the capacitor 82 is charged to $V_{tn}$, inverter 88 will turn on and invert the high capacitance voltage to a low ground voltage which is then inverted high by inverter 90. The change of inverter 90 output voltage from low to high thus releases control to the IC's registers.

The BiCMOS POR circuit 70 can detect serious voltage drops to a voltage $V_{Diode}+V_{tn}$, and provide a reset signal 92. Specifically, when the battery 80 falls to $V_{Diode}+V_{tn}$, a reset signal 92 is generated. This operation is important for detecting supply voltage drops and rapid discharge of the capacitor 82, and is an important design consideration to ensure reset under the voltage drop condition. The capacitor can rapidly. be discharged by designing $Q_4$ 78 to have a large width and small gate length to enable a large and rapid current drain to ground. By discharging the capacitor 82, the input of the voltage buffer is forced low to reset the system as intended.

The resistors 84 and 86 in FIG. 7 can be scaled to minimize current flow to improve power efficiency. $Q_3$ 74 can be scaled to increase or decrease delay time. Therefore, the BiCMOS POR circuit 70 has been designed in such a way as to be at nearly $2V_t$ (or $\cong 1.6$ Volts) when it sends the delayed POR control release signal. When the battery 80 reaches approximately $2V_t$, register reset is ensured since each set/reset register only requires the supply to be equal to $V_t$ for proper reset operation. Therefore, even given the circumstances of process and temperature variation, quick battery voltage rise and fall times, or voltage drops below a voltage of approximately $2V_t$, the BiCMOS POR circuit 70 is guaranteed proper register reset operation.

Figure 8:
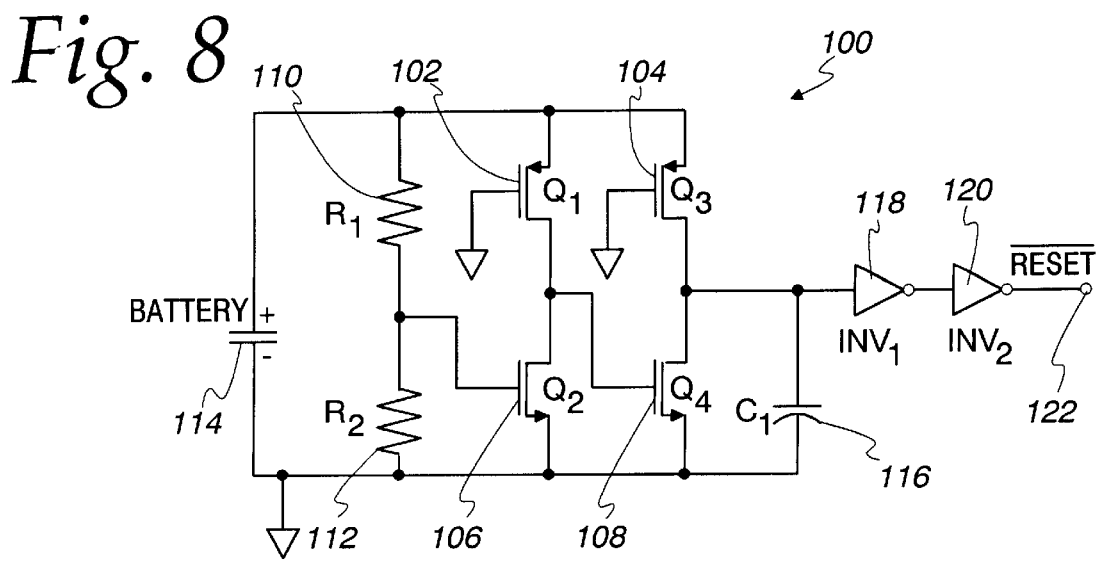
FIG. 8 is a circuit diagram of a preferred embodiment of the present invention.

Referring to FIG. 8, another preferred embodiment of the present invention is shown. A Resistive-Divider CMOS POR circuit 100 is shown consisting of a plurality of PMOS transistors 102 ($Q_1$) and 104 ($Q_3$) and NMOS transistors 106 ($Q_2$) and 108 ($Q_4$), two resistors 110 ($R_1$) and 112 ($R_2$), a battery 114, a capacitor 116, two inverters 118 and 120, and a reset output 122. Resistors 110 and 112 together comprise a voltage divider wherein resistors 110 and 112 are coupled together and resistor 110 is coupled to the battery and resistor 112 is coupled with ground. $Q_1$ 102 and $Q_2$ 106 are coupled together by their respective drains as shown. The source of $Q_1$ 102 is coupled with the battery 114 while the gate of $Q_1$ 102 is coupled with ground. The source of $Q_2$ 106 is coupled with ground while the gate of $Q_2$ 106 is coupled with resistors 110 and 112 as shown. $Q_3$ 104 and $Q_4$ 108 are coupled together by their respective drains as shown. The source of $Q_3$ 104 is coupled with the battery 114 while the gate of $Q_3$ 104 is coupled with ground. The source of $Q_4$ 108 is coupled with ground while the gate of $Q_4$ 108 is coupled with the drains of $Q_1$ 102 and $Q_2$ 106. The capacitor 116 is coupled with the drains of $Q_3$ 104 and $Q_4$ 108 and to ground.

The threshold voltage of the PMOS transistors 102 and 104 is $V_{tp}$. The threshold voltage of the NMOS transistors 106 and 108 is $V_{tn}$. Upon power-up of the circuit, when the battery 114 is connected, the voltage at the gate of $Q_2$ 106 begins to rise and becomes greater than $V_{tn}$, and $Q_2$ 106 begins to allow current to flow from the drain to the source. At the same time, the gates of $Q_1$ 102 and $Q_3$ 104 are connected to ground, so $Q_1$ 102 and $Q_3$ 104 allow current to flow from their sources to their drains. As a result, the gate of $Q_4$ 108 has a higher voltage than $V_{tn}$, and $Q_4$ 108 allows current to flow from its drain to its source. As $Q_2$ 106 allows current to flow from the source to the drain, the voltage at the gate of $Q_4$ 108 begins to drop below $V_{tn}$, and the flow of current from its drain to its source is stopped. Current then flows through the capacitor 116, charging the capacitor 116. Thus charging of the capacitor 116 occurs at $V_{cc}=V_{tn}(1+R_1/R_2)$. The resistive ratio $R_1/R_2$ can be scaled to provide a desired control release voltage to control when these events occur.

$Q_3$ 104 can be modeled as a resistor. This model resistor, combined with the capacitor 116, form a time delay that ensures the reset of the IC during a very rapid supply voltage rise. After the supply voltage rises above the operational range of the IC register's maximum $V_t$ ($V_{tp}$ for PMOS and $V_{tn}$ for NMOS), each flip flop and latch on the IC requires a certain amount of time for the reset signal 122 to be active to allow a reset operation to occur. If a very fast supply rise time does not provide a sufficient time interval between reaching the values of the IC register's maximum $V_t$ and the CMOS POR circuit 100 control release voltage, a properly calculated time delay can lengthen the reset time interval. As a result, the active reset signal of the CMOS POR circuit 100, as required by the flip flop or latch with the maximum reset time requirement, will be sufficiently long to allow reset of the IC.

It is the time delay which also provides for the maintenance of the reset signal for a certain time after the supply voltage returns to its nominal value. Consequently, once the capacitor 116 is charged to $V_{tn}$, inverter 118 will turn on and invert the high capacitance voltage to a low ground voltage which is then inverted high by inverter 120. The change of inverter 120 output voltage from low to high thus releases control to the IC's registers.

The Resistive-Divider CMOS POR circuit 100 can detect serious voltage drops of $V_{tn}(R_1/R_2)$ and provide a reset signal 122 upon voltage drop detection. Specifically, when the battery 114 falls to $V_{tn}(R_1/R_2)$, a reset signal 122 is generated. This operation is important for detecting supply voltage drops and rapid discharge of the capacitor 116, and is an important design consideration to ensure reset under the voltage drop condition. The capacitor can rapidly be discharged by designing $Q_4$ 108 to have a large width and small gate length to enable a large and rapid current drain to ground. By discharging the capacitor 116, the input of the voltage buffer is forced low to reset the system as intended.

The resistors 110 and 112 and $Q_1$ 102 of FIG. 8 can be scaled to minimize current flow to improve power efficiency. $Q_3$ 104 can be scaled to increase or decrease delay time. Therefore, the Resistive-Divider CMOS POR circuit 100 has been designed in such a way as to be at nearly $2V_t$ (or $\cong 1.6$ Volts) when it sends the delayed POR control release signal. When the battery 114 reaches approximately $2V_t$, register reset is ensured since each set/reset register only requires the supply to be equal to $V_t$ for proper reset operation. Therefore, even given the circumstances of process and temperature variation, quick battery voltage rise and fall times, or voltage drops below a voltage of approximately $2V_t$, the Resistive-Divider CMOS POR circuit 100 is guaranteed proper register reset operation.

The functionality of the preferred embodiments of the present invention are not always improved by providing a larger capacitor since the RC time delay can be designed to be as small as needed during a quick rising battery supply voltage. Thus when implemented on an IC, a lower capacitance can be utilized with good design choices to conserve costly silicon area.

Referring now to FIG. 9, a simulated timing operation of the BiCMOS POR circuit 70 of FIG. 7 during a battery supply voltage power-up is shown. The BiCMOS POR circuit output, which is designated here as ResetNOT, is shown under the condition of a battery voltage supply rise time of 1 μsecond. The BiCMOS POR circuit resets all registers, consisting of latches and flip-flops, by a time-delayed (2.5 μsecond in this case) low voltage and then releases control by changing to a high voltage state.

Referring now to FIG. 10, a timing diagram of the detection of a serious supply voltage drop is shown. Again, the POR circuit resets all registers by a time-delayed low voltage and then releases control by changing to a high voltage state.

In addition, for applications of lower supply voltages or in consideration of a circuit with a more flexible control release voltage, the Resistive-Divider CMOS POR 100 shown in FIG. 8 can be implemented to obtain a desired control release voltage. Since the Resistive-Divider CMOS POR circuit 100 also has a resistor/capacitor delay, register reset is ensured. Also, even given the same circumstances of process and temperature variation, quick battery voltage rise and fall times, or voltage drops below a desired control release voltage, the Resistive-Divider POR circuit 100 is guaranteed proper register reset operation.

Referring again to a preferred embodiment shown in FIG. 7, a circuit having values as described below has been fabricated, tested, and functionally verified. The resistances of resistor 84 and resistor 86 are each one mega-ohm. The capacitance of capacitor 82 is two picofarads. Transistor 72 is a standard bipolar transistor. PMOS transistor 74 has a width of 2 micrometers and a length of 65 micrometers. NMOS transistor 76 has a width of 4 micrometers and a length of 0.8 micrometers. NMOS transistor 78 has a width of 5 micrometers and a length of 0.8 micrometers. The simulation results for the circuit shown in FIG. 7 having components having values described above are provided in FIGS. 9 and 10.

It is to be understood that a wide range of changes and modifications to the embodiments described above will be apparent to those skilled in the art and are contemplated. It is, therefore, intended that the foregoing detailed description be regarded as illustrative rather than limiting, and that it be understood that it is the following claims, including all equivalents, that are intended to define the spirit and scope of the invention.

What is claimed is:

1. A power-on reset circuit comprising:
   a power supply;
   a voltage-referenced switching circuit coupled with the power supply, said voltage-referenced switching circuit comprising two NMOS transistors, one bipolar transistor and a plurality of resistors;
   a current source coupled with the voltage referenced-switching circuit and the power supply;
   a charge storage device coupled with the current source; and
   a voltage buffer coupled with the charge storage device and the current source.

2. The power-on reset circuit of claim 1, wherein the power supply is a battery.

3. The power-on reset circuit of claim 1, wherein the current source includes a transistor.

4. The power-on reset circuit of claim 1, wherein the charge storage device includes a capacitor.

5. The power-on reset circuit of claim 1, wherein the voltage buffer includes a first inverter and a second inverter coupled with the first inverter.

6. A method for resetting the operational state of electronic components of a device in response to fluctuations in voltage of a power source for the device, comprising the steps of:
   providing electronic components with operational states that are reset in response to a reset signal;
   applying the reset signal to said electronic components when the voltage of the power source is below a level required for operating said electronic components;
   following the voltage of the power source with a control voltage that is scaled to reduce power consumption;
   supplying a capacitor with electrical current and charging the capacitor when the control voltage equals or exceeds a predetermined control reference value;
   turning off said reset signal when the capacitor charges to a predetermined value of a capacitive reference voltage;
   scaling the charge time of the capacitor so that the reset signal is maintained to reset said electronic components when the voltage of the power source is sufficient to operate the electronic components;
   discharging the capacitor and applying the reset signal to reset said electronic components when the control voltage is reduced below said predetermined control reference value; and
   scaling the rate of discharge of the capacitor so that the electronic components are reset before the voltage of the power source drops below the operational voltage level for the components.

7. The method of claim 6, further including the step of using two NMOS transistors to control the charging and discharging of the capacitor and a PMOS transistor to supply the current to the capacitor.

8. The method of claim 6, further including the step of using a voltage divider including two resistors to provide said control voltage.

9. The method of claim 6, further including the step of using a voltage divider including an NMOS transistor and a PMOS transistor to provide said control voltage.

10. The method of claim 6, further including the step of using a voltage divider including a bipolar transistor and a resistor to provide said control voltage.

* * * * *